(12) United States Patent
Ho

(10) Patent No.: US 6,291,268 B1
(45) Date of Patent: Sep. 18, 2001

(54) LOW COST METHOD OF TESTING A CAVITY-UP BGA SUBSTRATE

(75) Inventor: Chung W. Ho, Hsinchu (TW)

(73) Assignee: Thin Film Module, Inc., Hsin-Chu (TW)

( * ) Notice: Subject to any disclaimer, the term of this patent is extended or adjusted under 35 U.S.C. 154(b) by 0 days.

(21) Appl. No.: 09/755,568

(22) Filed: Jan. 8, 2001

(51) Int. Cl.[7] .................................................. H01L 21/50

(52) U.S. Cl. ............................................................ 438/108

(58) Field of Search .................................. 438/108, 106, 438/14, 15, 18, 613, 617

(56) References Cited

U.S. PATENT DOCUMENTS

| | | | |
|---|---|---|---|
| 5,509,553 | 4/1996 | Hunter, Jr. et al. | 216/13 |
| 5,578,869 | 11/1996 | Hoffman et al. | 257/691 |
| 5,874,321 | 2/1999 | Templeton, Jr. et al. | 438/107 |
| 6,221,693 * | 4/2001 | Ho | 438/108 |

* cited by examiner

*Primary Examiner*—David Nelms
*Assistant Examiner*—Quoc Hoang
(74) *Attorney, Agent, or Firm*—George O. Saile; Stephen B. Ackerman

(57) ABSTRACT

A new method is provided for the testing of complex, high density flip chip packages. A temporary electrical short is provided by a layer of metal for all the interconnect metal lines of the package, vias are created in a surface of the package for the connection of the flip chips to the package. These vias are plated using either copper or copper followed by nickel and gold. The process of plating requires uninterrupted electrical paths between the vias that are being plated and the layer of metal that provides a temporary electrical short. Where this uninterrupted electrical paths is not present, due to problems of poor via creation or problems of opens in the interconnect lines of the package, the vias will be improperly plated and can as a result be readily identified. The metal layer that has provided the common short between all interconnect lines of the package is now patterned and probed for problems of shorts or opens.

27 Claims, 2 Drawing Sheets

LOW COST METHOD OF TESTING A CAVITY-UP BGA SUBSTRATE

This application is related to Ser. No. 09/332,427 filed on Jun. 14, 1999 now U.S. Pat. No. 6,221,693 assigned to a common assignee.

BACKGROUND OF THE INVENTION

(1) Field of the Invention

The invention relates to the fabrication of integrated circuit devices, and more particularly, to a method of testing cavity-up BGA substrate whereby an important step in the testing procedure is to define the last metal layer on the back of the metal panel by an etch or by a semi-additive plating process. The testing procedure of the invention does not require probing the high density flip chip pad array (that is flip chip bump pads and BGA pads) in order to test for defects of interconnect opens, thereby saving the cost of a sophisticated and expensive tester with tester fixtures.

(2) Description of the Prior Art

Increased packaging density of semiconductor devices has led to the design and effective use of many different types of semiconductor device packages. Multi layer structures have for this purpose been used to connect closely spaced integrated circuits with each other. Using this technique, a single substrate serves as an interconnect medium, multiple chips are connected to the interconnect medium forming a device package with high packaging density and dense chip wiring. The chip wiring contains layers of interconnect metal that are interconnected with interconnect vias, layers of dielectric (such as polyimide) or insulating layers separate metal layers that make up the interconnect network and the via and contact points that establish connections between the interconnect networks. The design of overlying and closely spaced interconnect lines is subject to strict rules of design that are aimed at improving package performance despite the high density packaging that is used. For instance, electrical interference between adjacent lines is minimized or avoided by creating interconnect lines for primary signals that intersect under 90 degree angles. Surface planarity must be maintained throughout the construction of multi-layer chip packages due to requirements of photolithography and package reliability. Many of the patterned layers within a layered structure form the base for overlying layers, lack of planarity can therefore have a multiplying effect on overlying layers.

One of the approaches that has in the past been used for high density packages that allows for the creation of high pin count integrated packages with various pin configurations is the creation of the Quad Flat Package (QFP). The pin I/O connections for these packages are typically established by closely spaced leads distributed along the four edges of the flat package. This limits the I/O count of the packages and therefore the usefulness of the QFP. The Ball Grid Array (BGA) package has been created whereby the I/O connects for the package are distributed around the periphery of the package and over the complete bottom of the package. The BGA package can therefore support more I/O points and provides a more desirable package for high circuit density with high I/O count. The BGA contact points are solder balls that in addition facilitate the process of flow soldering of the package onto a printed circuit board. The solder balls can be mounted in an array configuration and can use 40, 50 and 60 mil spacings in a regular or staggered pattern.

Where circuit density keeps increasing and device feature size continues to be reduced, the effect of the interconnect metal within the package becomes relatively more important to the package performance. Factors that have a negative impact on circuit performance, such as line resistance, parasitic capacitance, RC-delay constants, crosstalk and contact resistance have a significant impact on the package design and its limitations. A significant power drop may for instance be introduced along the power and ground buses where the reduction of the interconnect metal does not match the reduction in device features. Low resistance metals (such as copper) are therefore finding wider application in the design of dense semiconductor packages.

Increased I/O combined with increased performance requirements for high performance IC's has led to the development of Flip Chip packages. Flip chip technology fabricates bumps (typically Pb/Sn solder) on Al pads and interconnects the bumps directly to the package media, which are usually ceramic or plastic based. The flip-chip is bonded face down to the package through the shortest paths. These technologies can be applied not only to single-chip packaging but also to higher or integrated levels of packaging, in which the packages are larger, and to more sophisticated package media that accommodate several chips to form larger functional units.

The flip-chip technique, using an area array, has the advantage of achieving the highest density of interconnection to the device and a very low inductance interconnection to the package. However, pre-testability, post-bonding visual inspection, and Temperature Coefficient of Expansion (TCE) matching to avoid solder bump fatigue are still challenges. In mounting several packages together, such as surface mounting a ceramic package to a plastic board, the TCE mismatch can cause a large thermal stress on the solder lead joints that can lead to joint breakage caused by solder fatigue from temperature cycling operations.

U.S. Pat. No. 5,874,321 (Templeton Jr. et al.) shows a cavity up flip chip package and testing method. Also, shows a cavity down package FIG. 2. However, this reference differs from the invention.

U.S. Pat. No. 5,578,869 (Hoffman et al.) shows a metal base/panel for a package.

U.S. Pat. No. 5,509,553 (Hunter, Jr. et al.) shows a metal layer process (DEMR). FIG. 5a of this invention appears to comprise: a) sputter plating base, and b) plating metal (semi-additive plating). See also col. 2.

SUMMARY OF THE INVENTION

A principle objective of the invention is to provide a simple and inexpensive method for testing complex, high-density flip chip packages for electrical shorts or opens.

Another objective of the invention is to simplify the testing process that is typically required when testing complex, high-density flip chip packages for electrical shorts or opens.

Yet another objective of the invention is to eliminate the use of fixtures for chip probing, fixtures which are typically expensive, time consuming to build, unreliable and requiring frequent modifications and maintenance.

Yet another objective of the invention is to provide a method of testing complex, high-density flip chip packages for electrical shorts or opens that can be performed by visual inspection followed by simple procedures of probing for electrical shorts.

In accordance with the objectives of the invention a new method is provided for the testing of complex, high density flip chip packages. A temporary electrical short is provided by a layer of metal for all the interconnect metal lines of the package, vias are created in a surface of the package for the connection of the flip chips to the package. These vias are plated using either copper or tin or copper followed by nickel followed by gold. The process of plating requires uninterrupted electrical paths between the vias that are being plated through the interconnect lines, which are being tested, to the layer of metal that provides a temporary electrical short. Where this uninterrupted electrical path is not present, due to problems of poor via creation or problems of opens in the interconnect lines of the package, the vias will not be plated and can as a result be readily identified by visual inspection. The metal layer that has provided the common short between all interconnect lines of the package is now patterned, probed and inspected for problems of shorts or opens.

DESCRIPTION OF THE PREFERRED EMBODIMENTS

The above referenced related application that is assigned to a common assignee uses, for the creation of high-density BGA packages, a metal substrate on the surface of which is created a multi-layer interconnect substrate that is plastic based. The process of this related application starts with a metal panel, typically copper, but it can be other metals like aluminum or stainless steel, with a size of 18×24 inches, other sizes can obviously be used. It takes advantage of what is known in the printed wiring board industry as the BUM (Build Up Multilayer) in combination with thin film deposition equipment and processes used in the flat panel display industry to build high density packaging substrate devices.

To create this package, a first surface of a metal substrate is cleaned and used for the creation of the multi-layer interconnect substrate. This process of creation of the multi-layer interconnect substrate starts with the deposition of a layer of dielectric over the first surface (of the metal substrate) over which a layer of interconnect metal is deposited. The layer of interconnect metal is patterned to form the interconnect lines, this process can then be repeated with more depositions of layers of dielectric over which patterns of interconnect lines are formed. The last pattern of interconnect lines is covered with a solder mask and subsequently patterned to open an array of metal pads in the layer of dielectric, these metal pads are used for the connection of the BGA ball contact attachment.

The second surface of the metal substrate is next patterned to create openings in this second surface, these openings expose the first layer of dielectric that has been deposited on the first surface of the metal substrate. Openings are created in the exposed portions of the first layer of dielectric (typically using laser technology), these openings serve as flip chip bump pads to connect flip chips, which are mounted in the openings of the second surface of the metal substrate, to the interconnect substrate (that has been created as highlighted above on the first surface of the metal substrate).

Figure 1:
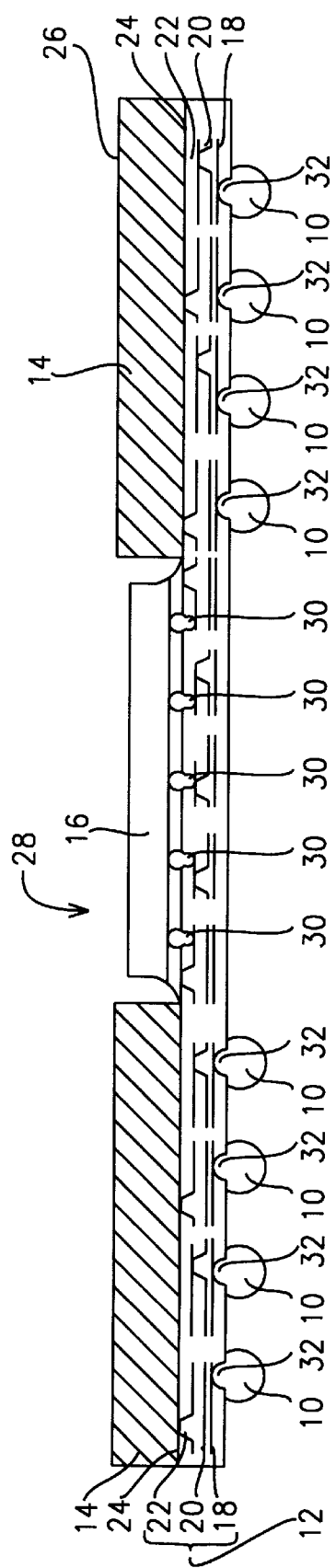
FIG. 1 shows a cross section of the above referenced related application of a single chip flip chip with three interconnect layers.

To further illustrate the processing steps that are part of the above referenced related application that is assigned to a common assignee, FIG. 1 of this related application will be referred to as part of the present application. FIG. 1 shows a cross section of a single flip chip with three interconnect layers.

The interconnect substrate 12 contains the totality of the sequence of layers that are created within the scope of the invention for making a high density packaging substrate.

The interconnect substrate 12 has two surfaces. The surface of the interconnect that is in contact with the metal substrate 14 is the second surface of the interconnect substrate, the surface of the interconnect substrate into which the contact balls 10 are mounted is the first surface of the interconnect substrate.

The metal layer within the interconnect substrate 12 that is closest to the first surface 24 of the metal substrate 14 is referred to as the bottom layer, the metal layer within the interconnect substrate 12 that is furthest removed from the first surface 24 of the metal substrate 14 is referred to as the top layer.

The metal substrate 14 has two surfaces, the first surface 24 of the metal substrate is the surface on which the interconnect substrate 12 is created. The second surface 26 of the metal substrate is the surface into which openings are etched for the insertion of BGA chips.

The three interconnect layers within the interconnect substrate 12 are highlighted as 18 (which can be a ground layer), 20 (which can be a power layer) and 22 (which can be a signal layer). Metal substrate 14, typically copper, is about 30 mils thick. The metal used for substrate 14 is not limited to copper but can be other metals such as aluminum or stainless steel. The size of the metal substrate 14 is typically 18×24 inches but the size of the metal substrate 14 is not limited to these dimensions. The invention uses the Build Up Multilayer (BUM) technology (a printed circuit board technology) in combination with thin film deposition technology (a technology used for the creation of flat panels).

It must be noted from FIG. 1 that the metal substrate 14 and the contact balls 10 are mounted on opposite sites of the interconnect substrate 12 while the metal substrate 14 and the contact balls 10 are also aligned with each other (the metal substrate 14 is located above the contact balls 10). The IC 16 is mounted in an opening 28 created in the metal substrate 14. The opening 28 into which the flip chip 16 is mounted is a cavity that is created by masking and etching of the second side 26 of the metal substrate 14.

A dielectric layer (not shown) is first deposited over the metal substrate 14 on the first side 24 of the metal substrate 14 as a first step in the creation of the interconnect substrate 12. This deposition of the dielectric can be done by either lamination or by a coating and curing process. The layer of dielectric typically has a thickness of between about 10 and 40 $\mu$m. It a required that the dielectric has a CTE that is higher than the CTE of the metal substrate. This to assure that, after the metal substrate with the deposited layer of dielectric are cooled down to room temperature, the dielectric film is under tension. The dielectric layer can be epoxy with or without a thin glass reinforcement, a polyimide film or any other build-up dielectric material.

The next step in the creation of the interconnect substrate 12 is the creation of a thin film interconnect metal layer 22 on top of the layer of dielectric. The thin film deposition technique contains the following steps of depositing an interconnect plating base by consecutive sputtering of Cr, Au and Cr, masking and patterning for semi-additive plating of the interconnect pattern, wet etching the thin Cr layer to expose the Au, depositing semi-additive plating of the interconnect pattern by depositing Au, Ni and Cu, removing of the mask for the semi-additive plating of the interconnect pattern, wet etching to remove the sputtered plating base from between the interconnect pattern, coating the created interconnect pattern with a layer of dielectric and, for applications where solder connections need to be made to the interconnect pattern, the above dielectric forms a solder mask and vias are created in the dielectric for the solder connections.

The state of the art BUM technology provides the technology to add layers 20 and 18 on top of the created thin film interconnect layer 22, these added layers 20 and 18 can typically be for power and ground interconnects but can also be used for fan-out interconnections. Patterns are created in the additional layers 20 and 18, typically for ground and power distribution but not limited to this. The last layer created in this manner, that is the layer 18 in FIG. 1 or the layer furthest removed from the first side 24 of the metal substrate 14, must provide interconnects with the contact balls 10 of the BGA structure and must therefore be coated as a solder mask.

The BUM state of the art technology contains the following processing steps of cleaning of the surface of the metal substrate, coating of the metal substrate with a dielectric, creating of vias in the dielectric for electrical connections to the metal substrate, etching and swelling of the dielectric to roughen the surface and thereby promote adhesion for the subsequent electroless copper deposition, electroless seeding of the dielectric, plating of the panel with a layer of copper, masking and etching the deposited layer of copper to create the metal pattern in the BUM layer.

The second side 26 of the metal substrate must next be prepared for the mounting of the flip chip 16; an opening or cavity 28 is therefore created in the metal substrate 14 that can accommodate the flip chip. The second side 26 of the metal substrate 14 is masked and etched to create opening 28. The size of this opening 28 can vary and depends on the number of flip chips that are to be mounted on the interconnect substrate 12. The etch of the second side 26 of the metal substrate exposes the dielectric layer that has previously been deposited (on the first side 24 of the metal substrate 14, see above). Openings 30 are created in this layer of dielectric through which the flip chip 16 can be connected to the contact points in the first layer 22. A laser is used to create these openings.

The openings 32 for the BGA solder ball connections are created to expose the top metal pads (the pads in the interconnect layer 12 that are furthest away from the metal substrate 14). The flip chip 16 is inserted into the interconnect layer 12 within the cavity 28, the interconnect layer 12 is brought into contact with the contact balls 10, electrical contact is then established between the flip chip 16 and the contact balls 10.

In summary, in the above referenced related application the minimum metal lines and spaces used are in the range of 12–40 μm and the dielectric insulation is 10–40 μm. Printed wiring board BUM is used in this related application to build the power supply layer as well as the interconnect line metal layer. High density interconnect layers are fabricated with the thin film interconnect layers. Typical steps of BUM processing are used for metal depositions while thin film sputter equipment (typically used for a flat panel creation process) is used to sputter metal in depositing a plating base for the semi-additive plating to make the thin film lines.

While the above FIG. 1 shows a cross section of a single chip flip chip with three interconnect layers, other applications of the same above referenced related application can be used to create for instance a single chip package with two interconnect layers, multi-chip structures that contains three interconnect layers in the interconnect substrate or multi chip packages with four interconnect layers contained within the interconnect substrate. The number of chips that are mounted using this method and the number of interconnect layers that are created in the substrate of the package are not limited by the method of the above referenced related application.

One of the concerns that relates to the flip chip package that has been described above is the testing of the package after the package has been completed or during intermediate steps while the package is being created.

The testing of high-density cavity up flip chip substrates for packaging is a very expensive step. The reason is that there is a contact pad array on the substrate unit that contains a large number of small pitch contact points for the flip chip bumps to connect to. A corresponding large number of very small size, high precision, therefore very expensive pins need to be made to probe these contact pads. For advanced semiconductor chips, the number of bumps may exceed 500, 800 or may even be in excess of 1000, with a bump pitch of 250 μm, 200 μm to less than 180 μm. Each of the probe pins may cost more than $30 US, so a fixture of more than 1000 pins becomes a very expensive proposition.

Normally, a testing fixture will need to be made to probe the flip chip pads described above while another set of much bigger and cheaper pins is used to contact the BGA ball pads on the other side of the substrate unit. The purpose of probing both sets of flip chip bump pads and BGA ball pads simultaneously is to test for defects of interconnect opens. To test for electrical shorts, only the set of BGA contact pins is used to probe the BGA ball pad array.

The present invention discloses an approach to eliminate the need to use an expensive set of fine probes to contact the flip chip pad array on the substrate unit.

A brief review of terminology may be of value at this time:

the flip chip package under discussion contains a flat metal panel and a multi-layer interconnect substrate the creation of the flip chip package starts with the metal panel, the metal panel has a front side and a back side a multi-layered substrate is created on the front surface of the metal panel, this multi-layered substrate contains layers of patterned interconnect lines that are separated by layers of dielectric while the first layer of the multi-layered substrate that is in contact with the front surface of the metal panel is a layer of dielectric the last layer of the multi-layered substrate, that is the layer that is furthest removed from the front surface of the metal panel, is a layer of patterned interconnect lines and contact pads (to make contact with the BGA balls of the package). A solder mask is deposited over this last layer of metal and patterned to exposed the metal contact pads, BGA ball attachments are to be made to these contact pads the back side of the metal panel is patterned and etched to create openings for the insertion of flip chips that are to be mounted in the package; this patterning exposes the first layer of dielectric that has been deposited over the front side of the metal panel, and openings are created in the exposed layer of dielectric, these openings serve to connect the flip chip bump to the substrate.

Using the method of testing of the invention, in fabricating the interconnect layers on the front side of the metal substrate, multilayer metal and dielectric layers are deposited and patterned the same way as in the previously disclosed invention except for the last metal layer. If the last metal layer is defined by etching the metal panel into lines, then, after the vias (between this metal layer and the adjacent layer of metal interconnect lines going in the direction of the front surface of the metal panel) and this last metal layer is formed but before this last metal layer is etched, all interconnect lines of the single chip BGA design are electrically shorted by this last metal layer. The same is true if the last metal layer is defined by a semi-additive plating process, that is after the metal lines are plated but before the plating base is etched, all the interconnect lines are electrically shorted by the last metal layer.

At this point, the front side of the panel is protected by a dielectric layer and the backside of the panel is selectively masked and etched to make (flip chip) die cavities, in the process exposing the first dielectric layer on the front side of the panel. An array of vias is made by laser equipment in the dielectric layer to expose the flip chip bump contact pads, this array of vias is recessed from the exposed dielectric layer with a depth equal to the thickness of the dielectric layer. In this case, the thickness is in the range of 10–25 $\mu$m. Now an electrolytic plating step is taken to deposit metal into the laser drilled vias, the back side of the metal panel where no cavities have been created is protected with a dielectric layer to prevent it from plating.

The plating of the flip chip bump contact pads using copper only or copper followed by nickel followed by gold will only take place inside the vias that have been created for the flip chip bump contact pads. The difference between the metal thickness of the metal that is present inside these vias before and after the plating step can be detected by inspecting the pads inside the vias. It is thereby assumed that for most of the applications there are no floating or unconnected interconnect lines within the interconnect structure to the BGA pads. This is always true for a single chip package. However, for multichip packages, there are floating interconnect lines between chips which do not come out to the last layer of the interconnect substrate. In such cases, one can simply bring out the floating lines to the last layer of the interconnect substrate through a short stub to the next available adjacent via position and then to one or more vies to a via pad on the last layer of the multilayer interconnect substrate. By doing so, all interconnect lines are shorted together by the last metal layer. The effectiveness of the plating for the application that uses nickel and gold for the plating process can be detected by observing the difference in color of the plated vias. If there is an open (interrupted line) in any of the interconnect lines that have been created in the multi-layered substrate overlying the metal panel, which can be due to an open line or to a bad via between the last layer of metal and the flip chip bump pads, then that particular pad will not get plated. This defect can then be detected by visual inspection.

In summary:
- the last layer of metal that is deposited on the interconnect substrate provides, prior to etching of this layer, an electrical short for all interconnect lines that are contained in the interconnect lines of the substrate. It is thereby assumed that there are no "floating" or unconnected interconnect lines within the interconnect substrate, if such "floating" or dangling pieces of metal were to be present in the interconnect substrate these pieces would serve no purpose and would therefore not need to be considered from a testing point of view
- the vias are created in the first layer of dielectric that has been deposited over the front surface of the metal panel, these vias are to be used for flip chip bump pad connections to the multi-layered interconnect substrate
- the created vias are plated, for this plating to be successful a current must be able to flow through the vias and into the (unetched) last layer of metal that is deposited on the interconnect substrate provides
- vias that are not properly plated indicated that the required current did not flow through the via
- not proper plating of the vias can be visually detected by observing thickness of deposited metal (on the surface of the via) or by observing the color of the surface of the via, and
- vias that are identified as not properly plated indicated a bad via contact (to the underlying flip chip bump pad) or an open in the interconnect line to which this via is connected.

After the via plating step, the last metal layer that has been deposited as part of the creation of the multi-layer interconnect substrate is etched to delineate the lines. Obviously, defects will still occur in this step. However, this is the last layer for the interconnect lines to terminate at the BGA pads. The fine lines for fan out have already been taken care of by the previous metal layers and vias, the lines that are created in the last layer of metal of the interconnect substrate are wider than the metal interconnect lines that are created in the preceding layers of metal and can therefore be detected by visual inspection. Electrical shorts can be tested electrically by probing the large BGA pads.

Figure 2:
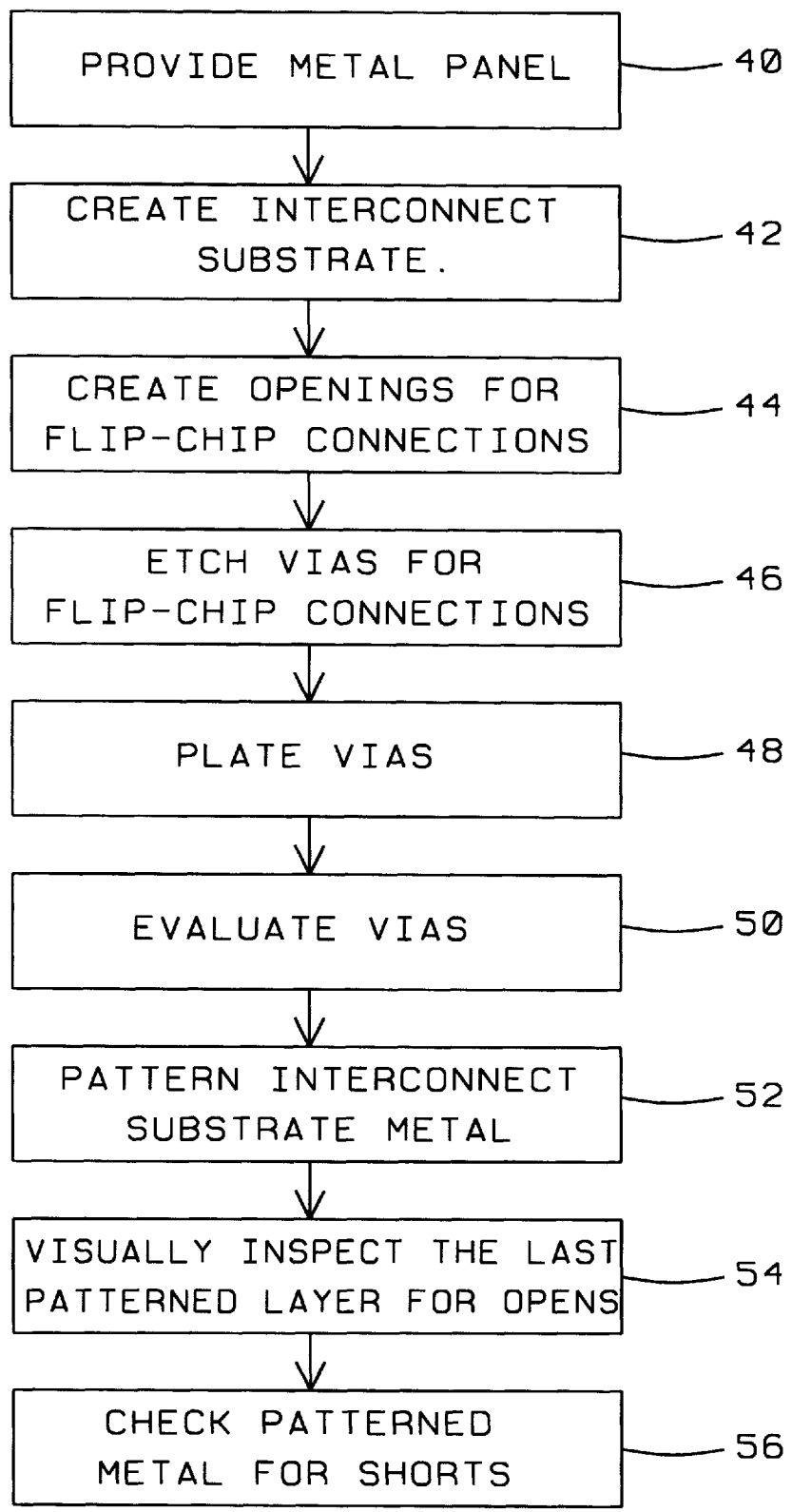
FIG. 2 shows the processing and testing sequence of the invention.

The method of the invention can now be identified using the flow diagram that is shown in FIG. 2. The steps of the invention are as follows:

FIG. 2, step 40, provide a metal panel, this is the metal panel that forms an integral part of the flip chip package that will be tested following the invention, FIG. 2, step 42, create a multi-layer interconnect substrate on a front surface of the metal panel, thereby leaving the last layer of metal that is deposited unetched and as one surface FIG. 2, step 44, create openings in a back surface of the metal panel for the insertion of the flip chips, these openings expose the first layer of dielectric that has been deposited on the front surface of the metal panel for the creation of the multi-layered interconnect substrate, FIG. 2, step 46, etch vias in the exposed layer of dielectric thereby exposing the pads in the multi-layered substrate to which flip chip bump pads must be connected, FIG. 2, step 48, plate the exposed pads, FIG. 2, step 50 visually observe thickness of the plated vias or the color of the surface of the plated vias, thereby identifying bad vias or open interconnect lines in the multi-layered interconnect substrate, FIG. 2, step 52 pattern the last layer of metal of the multi-layered interconnect substrate, FIG. 2, step 54, visually inspect the last layer of metal, and FIG. 2, step 56 probe the patterned last layer of metal of the multi-layered interconnect substrate for electrical shorts.

Details that relate to the method of testing of the invention and to the flow chart that is shown in FIG. 2 have already been provided in the preceding text and do therefore not require further description at this time. It is clear from the provided description that the method of the invention provides a simple and effective method of identifying poor via connections, opens in the network of interconnect lines that forms an integral part of the flip chip package in addition to a simple method of identifying shorts in the last layer of metal that is created for the multi-layered interconnect substrate.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a semiconductor package for mounting semiconductor devices said semiconductor package containing a metal panel having a first and a second surface, further containing a multi-layered interconnect substrate overlying said first surface of said metal panel, comprising the steps of:

providing a metal panel;

cleaning said first surface of said metal panel;

depositing a first layer of dielectric over said first surface of said metal panel;

depositing a first layer of interconnect metal over the surface of said first layer of dielectric;

patterning said first layer of interconnect metal, forming a first pattern of interconnect lines of said multi-layer interconnect substrate;

depositing the second layer of dielectric over said first layer of interconnect lines;

creating a via pattern in the second layer of dielectric;

depositing a second layer of metal over said second layer of dielectric, including said via pattern in said second layer of dielectric;

depositing a third layer of dielectric over said second layer of metal, protecting said second layer of metal;

masking and etching said second surface of said metal panel, creating one of more openings in said second surface of said metal panel for inserting of one or more semiconductor devices, furthermore partially exposing within said openings said first layer of dielectric deposited over said first surface of said metal panel;

creating a via pattern in said exposed first layer of dielectric deposited over said first surface of said metal panel, providing metal pads for electrical access to said interconnect substrate for said one or more semiconductor devices;

plating the metal pads inside the via pattern said plating to proceed to a predetermined thickness;

patterning said second layer of metal deposited over said second layer of dielectric, forming a second pattern of interconnect lines of said multi-layer interconnect substrate;

visually inspecting said second pattern of interconnect lines for electrical opens;

coating said second pattern of interconnect lines with a solder mask;

exposing metal pads within said second pattern of interconnect lines, providing points of electrical access to said multi-layer interconnect substrate;

probing said metal pads within said second pattern of interconnect lines for defects of shorts;

visually inspecting the pads of the vias of said via pattern created in said exposed first layer of dielectric deposited over said first surface of said metal panel thereby screening out electrically opens;

subdividing said metal substrate into individual substrates; and visually inspecting said individual substrates.

2. The method of claim 1 whereby said method is extended to allow for depositing and patterning of a multiplicity of metal interconnect layers said multiplicity of metal interconnect layers to contain a layer of dielectric over which a layer of interconnect metal is deposited and patterned whereby each deposition of a layer of dielectric is followed by creating a via pattern in the dielectric which is followed by a deposition and patterning of a metal interconnect layer said depositing and patterning of a multiplicity of metal interconnect layers to occur after said patterning said first layer of interconnect metal and prior to said depositing the second layer of dielectric over said first layer of interconnect lines.

3. The method of claim 1 wherein said plating the metal pads inside the via pattern uses copper as a source.

4. The method of claim 1 wherein said plating the metal pads inside the via pattern uses copper followed by nickel and gold as a source.

5. The method of claim 1 wherein said plating the metal pads inside the via pattern uses solder as a source.

6. The method of claim 1 wherein said plating the metal pads inside the via pattern uses tin as a source.

7. The method of claim 1 wherein said patterning said second layer of metal deposited over said second layer of dielectric is a process of semi-additive patterning.

8. The method of claim 1 wherein said semiconductor devices are flip chip devices.

9. The method of claim 1 wherein said creating a via pattern in the second layer of dielectric uses laser technology.

10. A method for creating and testing a semiconductor device package for mounting semiconductor devices said semiconductor devices package containing a metal panel having a first and a second surface, further containing a multi-layered interconnect substrate having a first and a second surface overlying said first surface of said metal panel whereby said second surface of said multi-layered interconnect substrate overlays said first surface of said metal panel, comprising the steps of:

providing a metal panel;

cleaning said first surface of said metal panel;

creating said multi-layered interconnect substrate overlying said first surface of said metal panel, said multi-layered interconnect substrate having a first layer of dielectric overlying said first surface of the metal panel;

creating one or more openings in said second surface of said metal panel thereby partially exposing the surface of said first layer of dielectric overlying said first surface of the metal panel;

creating a via pattern in said partially exposed surface of said first layer of dielectric deposited over said first surface of said metal panel, exposing metal pads in said multi-layered interconnect substrate for electrical access by said semiconductor devices;

plating the metal pads inside the via pattern;

evaluating quality of said plated metal pads inside the via pattern;

patterning said first surface of said multi-layered interconnect substrate, forming a pattern of interconnect lines on said first surface of said multi-layer interconnect substrate;

inspecting said pattern of interconnect lines on said first surface of said multi-layer interconnect substrate for electrical opens; and performing back-end processing of said semiconductor device package for mounting semiconductor devices.

11. The method of claim 10 wherein said creating said multi layered interconnect substrate overlying said first surface of said metal panel is:

depositing a first layer of dielectric over said first surface of said metal panel;

depositing a first layer of interconnect metal over the surface of said first layer of dielectric;

patterning said first layer of interconnect metal, forming a first pattern of interconnect lines of said multi-layer interconnect substrate;

depositing the second layer of dielectric over said first layer of interconnect lines;

creating a via pattern in the second layer of dielectric;

depositing a second layer of metal over said second layer of dielectric, including said via pattern; and depositing a third layer of dielectric over said second layer of metal, protecting said second layer of metal.

12. The method of claim 11 whereby said method is extended to allow for depositing and patterning of a multiplicity of metal interconnect layers said multiplicity of metal interconnect layers to contain a layer of dielectric over which a layer of interconnect metal is deposited and patterned whereby each deposition of a layer of dielectric is followed by creating a via pattern in the dielectric which is followed by a deposition and patterning of a metal interconnect layer said depositing and patterning of a multiplicity of metal interconnect layers to occur after said patterning said first layer of interconnect metal and prior to said depositing the second layer of dielectric over said first layer of interconnect lines.

13. The method of claim 10 wherein said plating is to proceed to a predetermined thickness.

14. The method of claim 10 wherein said evaluating the quality of said plated metal pads inside the via pattern is a visual inspection.

15. The method of claim 14 wherein said visual inspection evaluates thickness of said plated metal pads.

16. The method of claim 14 wherein said visual inspection evaluates color of said plated metal pads.

17. The method of claim 10 wherein said inspecting said pattern of interconnect lines on said first surface of said multi-layer interconnect substrate for electrical opens is a visual inspection.

18. The method of claim 10 wherein said back-end processing is:

coating said first surface of said multi-layered interconnect substrate with a solder mask;

exposing metal pads within said first surface of said multi-layered interconnect substrate, providing points of electrical access to said multi-layer interconnect substrate; and probing said metal pads within said second pattern of interconnect lines for defects of shorts.

19. The method of claim 10 with the additional steps of subdividing said metal substrate into individual substrates and inspecting said individual substrates said additional steps to be performed after completion of said back-end processing of said semiconductor device package.

20. The method of claim 19 wherein said inspecting said individual substrates is a visual inspection.

21. The method of claim 10 wherein said semiconductor devices are flip chip devices.

22. The method of claim 10 wherein said plating the metal pads inside the via pattern uses copper as a source.

23. The method of claim 10 wherein said plating the metal pads inside the via pattern uses copper followed by nickel and gold as a source.

24. The method of claim 10 wherein said plating the metal pads inside the via pattern uses solder as a source.

25. The method of claim 10 wherein said plating the metal pads inside the via pattern uses tin as a source.

26. The method of claim 10 patterning said first surface of said multi-layered interconnect substrate is a process of semi-additive patterning.

27. The method of claim 10 wherein said creating a via pattern in said partially exposed surface of said first layer of dielectric deposited over said first surface of said metal panel uses laser technology.

* * * * *